United States Patent [19]

Nellis et al.

[11] Patent Number: 4,717,627
[45] Date of Patent: Jan. 5, 1988

[54] DYNAMIC HIGH PRESSURE PROCESS FOR FABRICATING SUPERCONDUCTING AND PERMANENT MAGNETIC MATERIALS

[75] Inventors: William J. Nellis, Berkeley; Theodore H. Geballe, Woodside; M. Brian Maple, Del Mar, all of Calif.

[73] Assignee: The United States of America as represented by the United States Department of Energy, Washington, D.C.

[21] Appl. No.: 937,794

[22] Filed: Dec. 4, 1986

[51] Int. Cl.$^4$ ............................................. B22F 3/00
[52] U.S. Cl. ...................................... 428/552; 428/548; 428/565; 419/8; 419/9; 419/61; 419/66; 228/107; 228/196
[58] Field of Search ...................... 428/548, 552, 565; 419/8, 9, 61, 66; 228/196, 107

[56] References Cited

U.S. PATENT DOCUMENTS

| | | | |
|---|---|---|---|
| 4,255,374 | 3/1981 | Lemcke | 419/66 |
| 4,325,895 | 4/1982 | Morris | 419/66 |
| 4,490,329 | 12/1984 | Hare et al. | 419/51 |
| 4,497,873 | 2/1985 | Barker | 428/547 |
| 4,618,537 | 10/1986 | Takano et al. | 428/694 |
| 4,649,073 | 3/1987 | Suzuki et al. | 428/212 |
| 4,664,963 | 5/1987 | Sakai et al. | 428/179 |

*Primary Examiner*—Stephen J. Lechert, Jr.
*Attorney, Agent, or Firm*—John F. Schipper; Clifton E. Clouse, Jr.; Judson R. Hightower

[57] ABSTRACT

Shock wave formation of thin layers of materials with improved superconducting and permanent magnetic properties and improved microstructures.

17 Claims, 9 Drawing Figures

DYNAMIC HIGH PRESSURE PROCESS FOR FABRICATING SUPERCONDUCTING AND PERMANENT MAGNETIC MATERIALS

The U.S. Government has rights in this invention pursuant to Contract No. W-7405-ENG-48 between the U.S. Department of Energy and the University of California, for the operation of Lawrence Livermore National Laboratory.

FIELD OF THE INVENTION

This invention relates to preparation, using shock wave propagation, of solid materials with new superconducting and permanent magnetic properties.

BACKGROUND OF THE INVENTION

Certain solid materials manifest desirable electrical or magnetic properties when thin samples, of thicknesses from one micrometer (microns or $\mu$m) to ten millimeters (mm), are prepared and used. One problem with some of these materials is that their preparation is not straight forward, but requires slow and costly techniques and often produces such materials in very small volume. The invention described and claimed herein provides relatively inexpensive method and apparatus for preparing these materials in reasonable volume.

SUMMARY OF THE INVENTION

One object of the invention is to provide method and apparatus to form materials of thickness a few microns or more that have saturation magnetic fields of five kilo-oersteds or greater.

Another object is to provide metnod and apparatus to form new solid materials of thickness a few microns or more that have superconducting critical magnetic fields of at least 150 kilogauss and may be embedded in a metallic medium.

Other objects of the invention, and advantages thereof, will become clear by reference to the detailed description and the accompanying drawings.

To achieve the foregoing objects, in accordance with the invention, the method in one embodiment (for powders) may comprise: providing three planar layers of materials, with layer #2 containing a powder containing one or more predetermined constituents and being contiguous to and positioned between layers #1 and #3 along the two exposed planar surfaces of 190 2, and with layers #1 and #3 being predetermined solid metallic materials; providing a rigid planar surface contiguous with one of the planar surfaces of layer #3 so that layer #3 lies between layer #2 and the rigid planar surface; providing a supersonic shock wave that passes through layers #1, #2 and #3 in that order; confining the three-layer assembly on all sides so that the assembly withstands boundary deformation pressures of up to 1 Megabar; allowing the powder in layer #2 to at least partially melt and coalesce into a higher density layer; and allowing the excess thermal energy in layer #2 to rapidly flow into the adjacent layers #1 and #3.

The method in another embodiment (for films and bulk materials) may comprise: providing three planar layers of materials, with layer #2 containing a film or bulk material that contains one or more predetermined constituents and is contiguous to and positioned between layers #1 and #3 along the two exposed planar surfaces of #2, and with layers #1 and #3 being predetermined solid metallic materials; providing a rigid planar surface contiguous with one of the planar surfaces of layer #3 so that layer #3 lies between layer #2 and the rigid planar surface; providing a supersonic shock wave that passes through layers #1, #2 and #3 in that order; confining the three-layer assembly on all sides so that the assembly withstands boundary deformation pressures of up to 1 Megabar; and allowing the excess thermal energy in layer #2 to rapidly flow into the adjacent layers #1 and #3.

DETAILED DESCRIPTION

The invention relies in part on the following experimental observations, which are confirmed by theoretical calculations utilizing measured shock wave equation-of-state data: (1) When a metallic solid is compressed by a shock wave of given strength, the resulting rise in temperature is only 10–20 percent of the resulting temperature rise where a powder of the same solid is compressed (and melted) by a shock wave of the same strength; (2) Where a thin layer of metallic powder is compressed, heated and melted by a shock wave and the resulting mass is contiguous on at least one side with a metal layer at much lower temperature, the majority of heat loss or cooling of the higher temperature material will occur by flow of heat to the contiguous metal layer rather than by flow to any adjacent material. As used herein, a "layer" of powder will refer to either a thin sheet or a line of such powder. A shock wave propagated through any powder with density of the order of 50 percent of solid density will produce a material of much higher temperature than the temperature of the equivalently shocked solid material.

Figure 1:
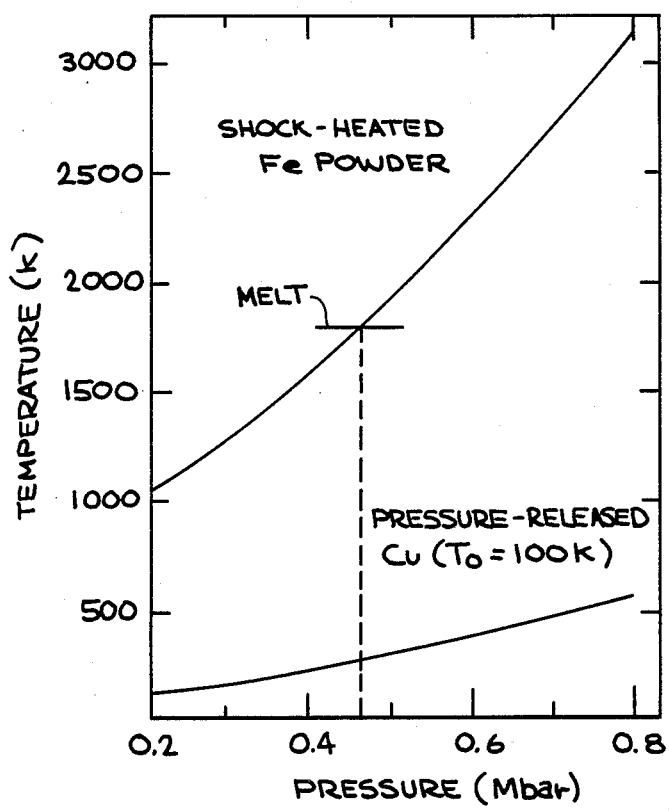
FIG. 1 is a graphic view of calculated residual temperature, as a function of maximum shock wave pressure, after passage of a shock wave through two representative materials, solid Cu and Fe powder (initial average density $\rho = 4.8$ gm/cm$^3$), both with initial temperature T = 100° K., where the Fe powder is assumed to be initially embedded in the Cu.

As an example, FIG. 1 exhibits the calculated residual temperature $T_r$ (after pressure release) reached in shock-heated Fe powder, initially of average density $\rho = 4.8$ gm/cm$^3$ and at temperature $T_O = 100°$ K., and in solid Cu as a function of the maximum pressure $P_m$ generated in the material by the shock wave. For $P_m$ 0.47 Mbar in this Fe powder encapsulated in solid Cu, $T_r$ exceeds $T_{melt}(Fe) \approx 1800°$ K. and the powder melts and coalesces. At this point, the temperature $T_r$ in solid Cu may be approximately 300° K. The temperature $T_r$ (Fe) is quenched by rapid temperature equilibration between the Fe and the contiguous Cu.

Figure 2:
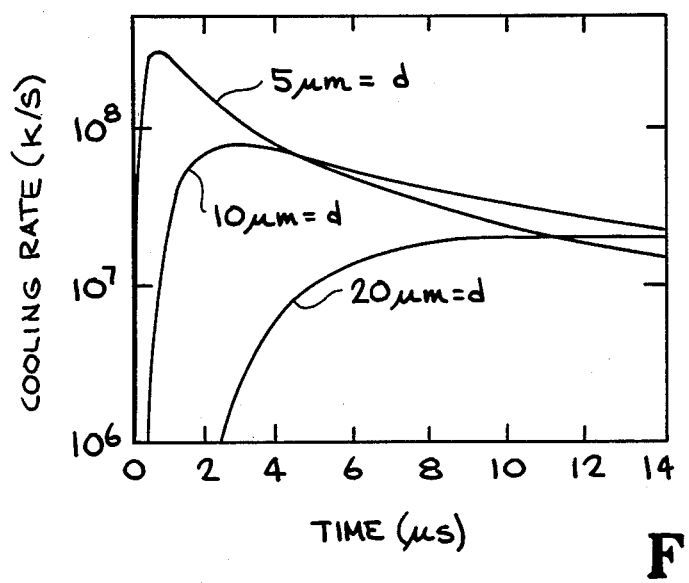
FIG. 2 is a graphic view of calculated cooling rate, at various depths d, of a planar layer of Fe powder that has been compressed by passage of a 0.5 Mbar shock wave through the Cu and the powder layer.

FIG. 2 is a graphic view of calculated cooling rates ($10^6$–$10^9$ °K./sec) versus time for shock heated Fe powder ($P_{max} = 0.55$ Mbar) contiguous with solid Cu, for various depths d within the Fe material. At smaller depths than $d < 5$ μm within the Fe, the cooling rate may exceed $10^9$ °K./sec.; this rate peaks within a few hundred nanoseconds and subsequently falls to a rate below the rates extant at greater depths. The high cooling rates available near the Fe-Cu interface in Fe are believed to produce fine-grain crystalline or amorphous Fe (or other material) processed in this manner; this belief is based upon the fabrication of amorpnous and fine-grain Fe alloys by the well-known melt spinning method, with a maximum quench rate of about $10^6$ °K./sec. This fine-grain structure is required for superconductors with high critical magnetic fields and high critical electrical currents and for permanent magnetic materials with high coercivities ($\approx$ five kilo-oersteds and greater). The effectively uniaxial nature of the shock pressure pulse produces a preferred crystalline orientation that is useful for producing permanent magnetic materials. High temperatures are achieved in a confined specimen (constrained on all boundaries) at high pressure so that mixtures of materials with greatly differing volatilities can be combined without losing the more volatile constituents.

Superconducting materials for high magnetic fields and high electrical current are embedded in a metallic medium (e.g., Cu or Al) in order to provide thin, superconducting layers with sufficient strength to withstand the large electromagnetic forces present in a high field superconducting magnet and to provide a controlled, nondestructive current path, if the material undergoes a transition from superconducting state to normal state. The process described herein embeds synthesised materials in a metallic matrix, and the resulting composite may then be used for high-field superconducting magnet applications. This technique is also useful for synthesising new superconducting materials, using very fast thermal and pressure quench rates.

Figure 3:
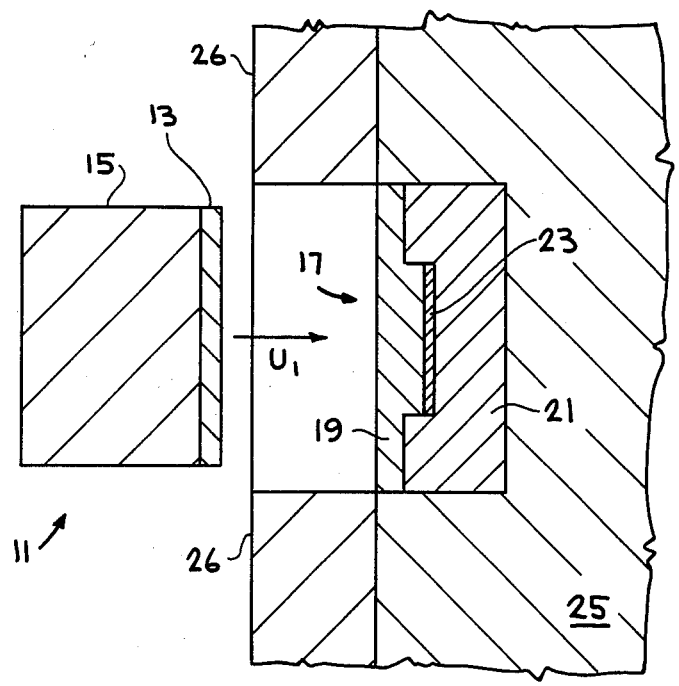
FIG. 3 is a schematic view of one embodiment of apparatus suitable for practicing the invention for powder specimens.

One embodiment of apparatus to accomplish the dynamic high pressure compaction and quenching of the powder, shown in FIG. 3, uses a projectile 11 comprising a metal impactor 13 (Cu, Al, etc.) with a ductile backing material 15 of plastic or other suitable material to attenuate the rearward-moving shock wave after impact. The plastic also serves to hold the metal impactor during the impactor's acceleration by a gas gun. The projectile 11 is initially caused to move at supersonic speed toward a target 17 that includes a first substantially planar sheet 19 of Cu, Al, steel or similar material, and a parallel second solid planar sheet 21 of a similar material, with a thin planar layer or line 23 of the powder positioned between and contiguous with the solid layers 19 and 21 as shown. Hereafter, the phrase "transversely contiguous", applied to two or more planar layers of material, will mean that these layers are parallel to and contiguous to one another along a common plane that defines each of the planar layers. A strong back-up layer 25, of steel or other suitable material, is positioned parallel to and transversely contiguous to the rear exposed surface of the second solid planar layer 21, in order to constrain layers 19, 21 and 23 at their external boundaries and to dissipate part or all of the shock wave energy after the wave passes once through the planar layers 19, 23 and 21. As shown in FIG. 3, the back-up material 25 wraps around the sides of layers 19, 21 and 23 to constrain lateral deformation. Lead or some other heavy material 26 is preferably positioned at the sides of the target adjacent to the plane of impact, leaving clearance for passage of the projectile, to prevent this surface from "blowing out" as the pressure waves travel outward from the impact area.

The projectile 11 impacts an exposed, parallel, planar surface of the first planar layer or sheet 19, at a velocity of substantially 0.2–4 km/sec. The shock wave generated in the first planar layer moves progressively through the powder layer 23, the second solid planar layer 21 and the back-up layer 25; and the powder in layer 23 is melted and caused to coalesce for sufficiently high shock pressures.

Figure 4:
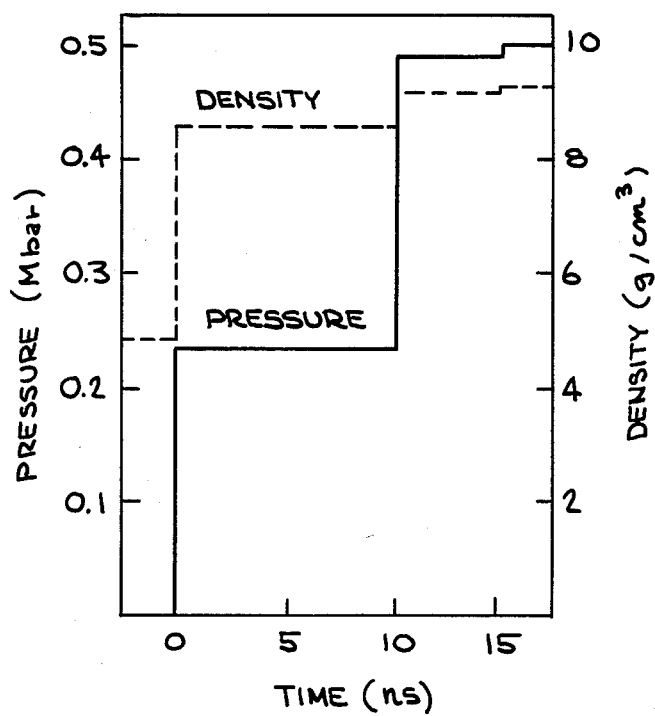
FIG. 4 is a graphic view of pressure and density, as a function of time, sensed by a planar layer of Fe powder as a 0.5 Mbar shock wave passes from the Cu through the powder layer, initially 50 $\mu$m thick.

The powder layer 23 may initially have a material average density of substantially 50 percent of theoretical solid density and may have a thickness of 10–500 μm. The energy deposition time in the powder layer is small, 3–100 nsec., compared to the time, 100–500 nsec., that the powder layer is held at that pressure to react chemically. The time intervals that the powder materials are held at high temperatures and pressures may be controlled by varying the thickness and width of the impactor plate. FIG. 4 indicates that, for initial powder layer density $\rho_o(Fe) = 4.8$ gm/cm$^3$, the density after passage of the shock wave reaches $\rho(Fe) = 9.2$ gm/cm$^3$ for a 0.55 Mbar pressure shock wave; this latter density is 1.2 times crystal density and may induce formation of a new solid phase when the molten layer quenches to a solid state.

Figure 6:
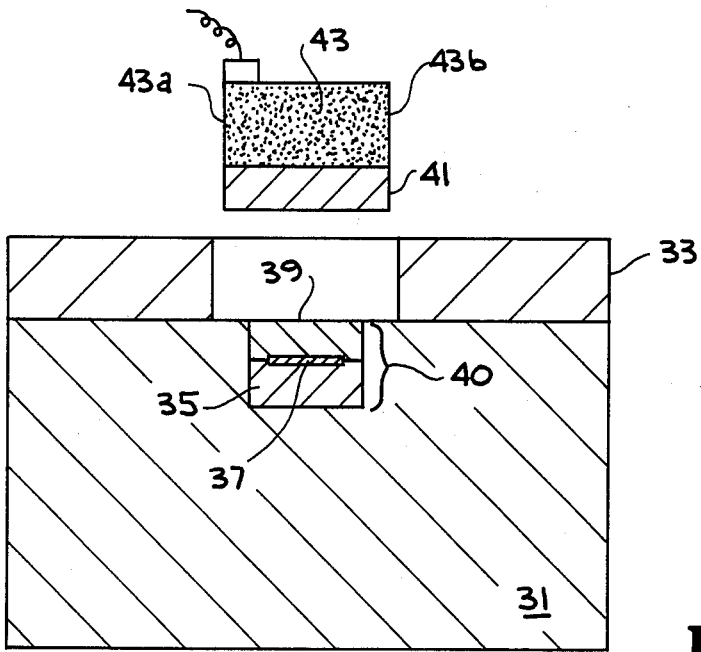
FIG. 6 is a schematic cutaway view of an alternative approach to shock wave generation in the powder layer, using a tecnnique related to explosive welding.

Alternatively, the embodiment shown in FIG. 3 may be replaced by one in which the first Cu layer 13 is positioned (stationary) at the target 17 and the projectile 11 includes a planar impactor 41 of steel or other suitable material, backed by a layer of a suitable high explosive 43 that is detonated to move the projectile against the target, as shown in FIG. 6. By detonating the explosive at one end, a travelling detonation wave in the explosive generates a travelling pressure wave that forces the projectile plate against the target. In this manner, large lengths or areas of such materials can be synthesized and embedded in Cu or other ductile material.

The bulk materials (e.g., Cu, Al, steel) surrounding and contiguous with the powder may be 1–10 mm thick. These materials may be pre-cooled to temperatures of the order of 80–100° K, to reduce the residual temperature attained by such material after passage of the shock wave therethrough and to thereby increase the powder-bulk material temperature difference and specimen temperature quench rate. Since the shock wave amplitude and residual temperature each attenuate as the wave moves away from the impact area, pre-cooling also provides a heat sink for rapid cooling close to the specimen, irrespective of the residual shock temperature of the specimen. For certain applications, the initial temperature may be increased to several hundred degrees Kelvin to synthesize a new product at lower shock wave pressure and/or permit post-shock annealing to achieve a desired grain size or microstructure.

For pressures that are less than required for complete melting of the powder layer, shock powder particles will melt primarily on the surfaces thereof and fuse together when the interstitial regions quench to the solid state. A fine-grain microstructure is required for superconductors with high critical magnetic fields and high critical electrical currents, and for permanent magnetic materials with high coercivities (5–20 kilo-oersteds). These can be obtained by varying the shock pressure and temperature to vary crystallite chemical composition, structure, size and orientation, as well as the multiplicity of phases induced in the compacted powder. These features are important for pinning superconductor flux lines in superconductors and magnetic flux lines in hard permanent magnets. Thus, shock wave pressures varying from the minimum required to barely compact a powder into a monolithic layer, up to that required to totally melt and thermally quench the powder particles, are important for synthesis here. Suitable powder materials for preparing superconducting materials with high critical magnetic fields include: Pb/Mo/S, Eu/Mo/S, Sn/Eu/Mo/S, Pb/Eu/Mo/S, La/Eu/Mo/S, Sn/Mo/S, Sn/Al/Mo/S, Nb/N, Mo/N, V/Si, Nb/Si, Nb/Ge, Nb/Al/Ge, Nb/Al, Nb/Ga, Nb/Ti and Nb/Zr. Suitable materials for preparation of permanent magnetic material with high coercivity include: Sm/Co, Fe/B/x and Fe/B/x/y, where the materials x and y are drawn from a group including Nd, Pr, Sm, Eu, Co and Ni.

FIG. 6 illustrates an alternative approach to generation of shock waves in the powder layer, using a technique related to explosive welding of two plates. The purpose of this technique is to use explosives to fabricate arbitrarily long lengths or large areas of the desired material. One provides, as usual, a back-up plate 31 (steel or such) and an impact cushion layer 33 of Pb or similar high density material at the side of the impact area; first and second planar layers 39 and 35 of Cu or similar material, with a tnin layer of powder 37 sandwiched between these two layers; an impactor plate 41 spaced apart from the three-layer sandwich 40; and a layer 43 of high explosive positioned to detonate and drive the impactor plate against the three-layer sandwich 40. The high explosive 43 is detonated at one end 43A, and the detonation front proceeds toward the other end 43B. As the detonation front advances longitudinally from one end 43A to the other end 43B, successive portions of the impactor plate are driven against the three-layer sandwich, producing a rolling motion of impactor plate 41 against the sandwich 40. This produces a travelling high pressure shock wave in the layers 35, 37 and 39 that again causes the layer 37 of powder particles to partially or fully melt and to fuse together as desired. This technique is used in explosive welding, where the object is to weld the impactor plate and the adjacent plate together. Here, the object is to drive long lengths or large areas of the layers 35, 37 and 39 together; and the choice of shock wave pressures and other parameters may differ from the choices for "pure" explosive welding.

We have performed dynamic compaction experiments on two representative powder compounds, 51 weight percent Cu/49 weight percent Zr and $Pb_{1.2}Mo_6S_8$, to assess the effect of shock pressure on the final structure of the material. For the Cu/Zr compound, 160 kbar shock pressure produced a compacted mixture, with some melting of the powder particle boundaries but with some voids still showing; application of 600 kbar shock pressure produced a very fine grain structure with no trace of the original individual powder particles. Application of 160 kbar shock pressure to the much harder Pb/Mo/S compound left large voids, with many of the original powder particles being observable and little or no melting of powder particle boundaries; shock pressure of 600 kbar produced a fine grain structure and some evidence of melting, but with some large voids.

The invention for processing films or bulk specimens relies in part on the following observations, which are confirmed by experiments and theoretical calculations utilizing measured shock wave equation-of-state data.

(1) When a material is subjected to high pressure and temperature, it is possible to induce a new crystal structure that is more stable at the higher pressures and densities. If sufficiently high temperature is also present, the rate of transformation to the new phase is increased substantially; if the specimen can be quenched sufficiently quickly, a metastable, high pressure crystal will result. Because shock pressures and the resulting temperature rises can be applied and released extremely quickly (in times less than a microsecond), shock waves are useful for promoting irreversible (on shock wave time scale) transformations to synthesize and quench metastable materials.

(2) When a ductile metallic solid, such as Cu, Al, steel or similar material, is compressed by a shock wave of a given strength, this material is also heated by the shock wave. However, such materials remain ductile at high pressure and do not undergo phase transitions at such pressures. Such materials can thus be used as capsules to contain materials that are more brittle; these latter materials can be shock-synthesized to produce metastable superconducting or permanent magnetic materials. The shock pressures and temperatures attained in the ductile materials are comparable to the pressures and temperatures attained in the more brittle specimens embedded in the ductile materials.

(3) Maximum shock pressures and temperatures can be localized to the specimen and the portion of the (ductile) capsule immediately adjacent to the specimen. As the shock wave moves away from the specimen, the shock heating attenuates with increasing distance and leaves the specimen surrounded by a cooler heat sink region.

(4) When the maximum shock pressure of the specimen is released, the reversible portion of the shock internal energy is given up, and the specimen temperature decreases at a rate up to $10^9$ °K per second. The remaining thermal energy is removed quickly by thermal diffusion to the surrounding heat sink.

(5) After the layer of superconducting or permanent magnetic material (the "specimen material") has been shock-compressed and heated in this manner, some of the shock wave energy can be absorbed in an irreversible transformation to a new phase of the material, with a correspondingly smaller portion of the shock wave energy being available for dynamic heating of the material before flow of this heat to any contiguous layer of adjacent material.

(6) After removal of the shock wave pressure, the ductile material will recover to substantially its original material state, but the specimen material may retain its new state, with a new phase and possibly higher density than that of the original specimen material. In this manner, metastable materials can be shock synthesized.

As an example, FIG. 1 exhibits the calculated residual temperature $T_r$ (after pressure release) reached in shock-heated solid Cu, initially at temperature $T_O = 100°$ K., as a function of the maximum pressure $P_m$ generated in the material by the shock wave. For Cu shocked at $P_m = 0.74$ Mbar and 0.98 Mbar, the temperatures $T_r$ are estimated at 500° K. and 800° K., respectively. Where a Nb film is shocked in a similar manner, the tempertures $T_r$ for $P_m = 0.74$ Mbar and 0.98 Mbar are estimated as 650° K. and 1000° K., respectively.

The fast dynamic deformation process can produce a fine grain structure in the specimen material. This fine-grain structure is required for superconductors with high critical magnetic fields and high critical electrical currents and for permanent magnetic materials with high coercivities ($\approx$ five kilo-oersteds and greater). The effectively uniaxial nature of the shock pressure pulse produces a preferred crystalline orientation that is useful for producing permanent magnetic materials. High temperatures are achieved in a confined specimen (constrained on all boundaries) at high pressure so that mixtures of materials with greatly differing volatilities can be combined without losing the more volatile constituents.

Figure 7:
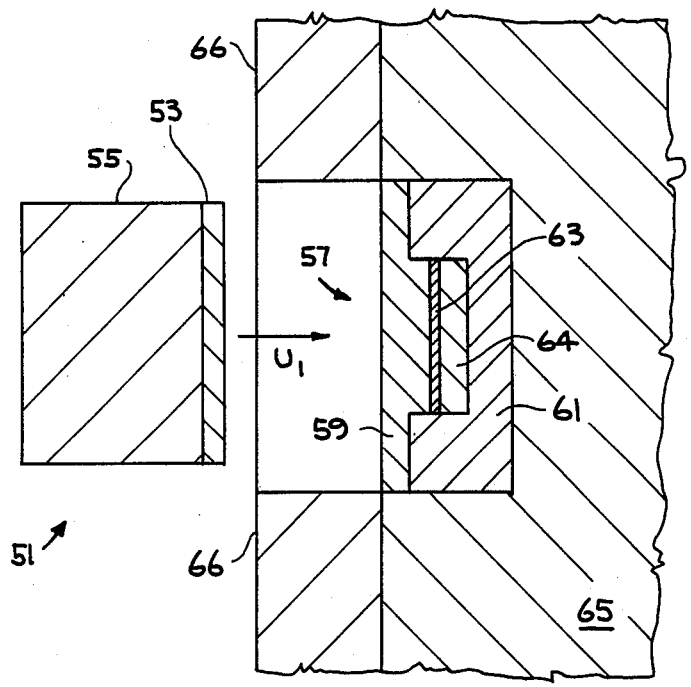
FIGS. 7 and 8 are schematic views of embodiments of apparatus suitable for practicing the invention, using film (with a substrate) or bulk specimens.
Figure 8:
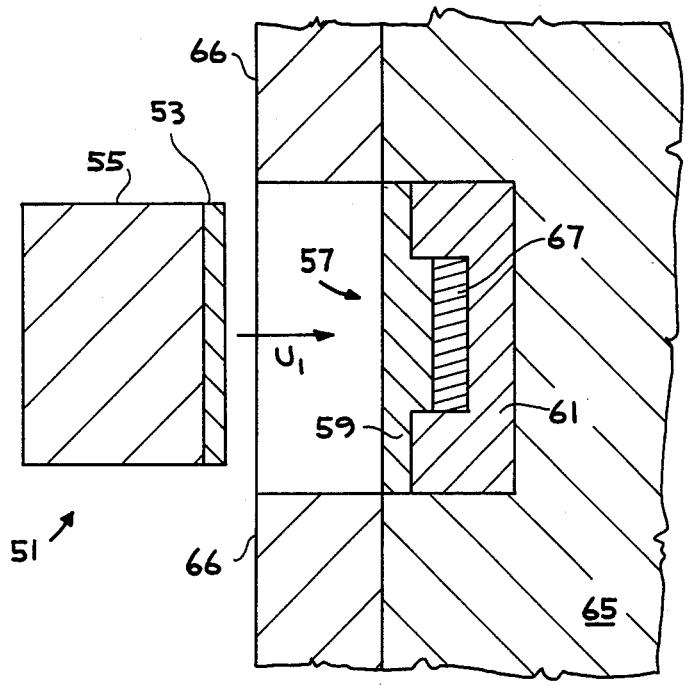

One embodiment of apparatus to subject films and bulk specimens to dynamic high pressures, shown in FIGS. 7 and 8, uses a projectile 51 comprising a metal impactor 53 (Cu, Al, etc.) with a ductile backing material 55 of plastic or other suitable material to attenuate the rearward-moving shock wave after impact. The plastic also serves to hold the metal impactor during the impactor's acceleration by a gas gun. The projectile 51 is initially caused to move at supersonic speed toward a target 57 that includes a first substantially planar sheet 59 of Cu, Al, steel or similar material, and a parallel second solid planar sheet 61 of a similar material, with a planar layer of film or bulk material 63 (and a film substrate 64 of Cu, steel, sapphire or such, where a film specimen is to be processed) of the specimen material positioned between and contiguous with the solid layers 59 and 61 as shown. A strong back-up layer 65, of steel or other suitable material, is positioned parallel to and transversely contiguous to the rear exposed surface of the second solid planar layer 61, in order to constrain layers 59, 61 and 63 at their external boundaries and to dissipate part or all of the shock wave energy after the wave passes once through the planar layers 59, 63 and 61. As shown in FIG. 7, the back-up material 65 wraps around the sides of layers 59, 61, 63 and 64 to reduce lateral deformation.

The projectile 51 impacts an exposed, parallel, planar surface of the first planar layer or sheet 59, at a velocity of substantially 0.2–4 km/sec. A shock wave generated in the first planar layer 59 moves progressively through the layers 63, 61 and 65; and the specimen material in layer 63 undergoes a permanent phase transition for sufficiently high pressures. An optional Pb block positioned to the side provides further stability.

The specimen material layer 63 may initially have a material average density of substantially 100 percent of theoretical solid density and may have a thickness of 1–10$^4$ $\mu$m. The time intervals that the specimen material is held at high temperatures and pressures may be controlled by varying the thickness and width of the impactor plate.

The bulk materials (e.g., Cu, Al steel) surrounding and contiguous with the specimen material may be 0.1–10 mm thick or more. These materials may be pre-cooled to temperatures of the order of 80–100° K., to reduce the residual temperature attained by such material after passage of the shock wave therethrough and to thereby increase the ductile-specimen material temperature difference and specimen temperature quench rate. Because the shock wave amplitude and residual temperature each attenuate as the wave moves away from the impact area, pre-cooling also provides a heat sink for rapid cooling close to the specimen material, irrespective of the residual shock temperature of that material. For certain applications, the initial temperature may be increased to several hundred degrees Kelvin to synthesize a new product at lower shock wave pressure and/or permit post-shock annealing to achieve a desired grain size or microstructure.

A fine-grain microstructure is required for superconductors with high critical magnetic fields and high critical electrical currents, and for permanent magnetic materials with high coercivities (5–20 kilo-oersteds). These features are important for pinning superconductor flux lines in superconductors and magnetic flux lines in hard permanent magnets. Suitable specimen materials for preparing superconducting materials with high critical magnetic fields include: Pb/Mo/S, Eu/Mo/S, Sn/Eu/Mo/S, Pb/Eu/Mo/S, La/Eu/Mo/S, Sn/Mo/S, Sn/Al/Mo/S, Nb/N, Mo/N, V/Si, Nb/Si, Nb/Ge, Nb/Al/Ge, Nb/Al, Nb/Ga, Nb/Ti and Nb/Zr. Suitable materials for preparation of permanent magnetic material with high coercivity include: Sm/Co, Fe/B/x and Fe/B/x/y, where the materials x and y are drawn from a group including Nd, Pr, Sm, Eu, Co and Ni.

Figure 9:
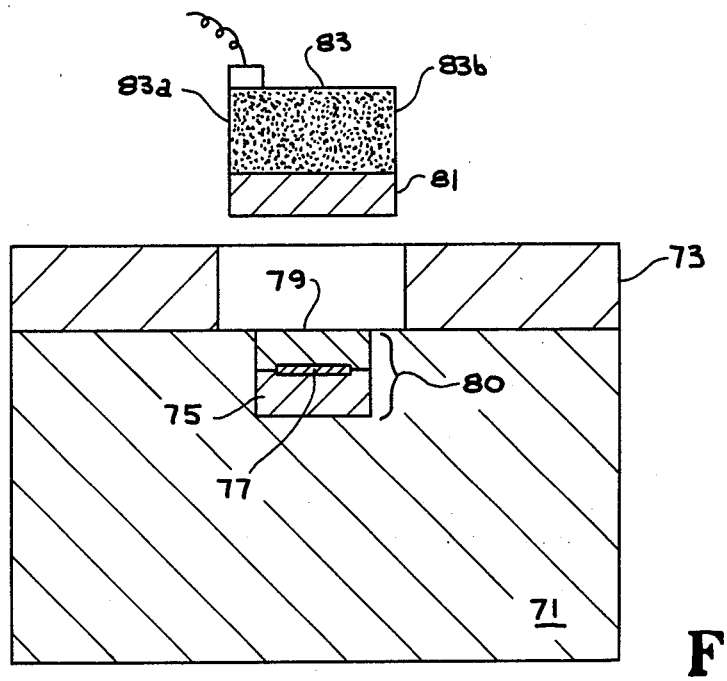
FIG. 9 is a schematic view of a second embodiment of apparatus suitable for practicing the invention, using film or bulk specimens.

FIG. 9 illustrates an alternative approach to generation of shock waves in the specimen material layer, using a technique related to explosive welding of two plates. One provides, as usual, a back-up plate 71 (steel or such) and an impact cushion layer 73 of Pb or similar high density material at the side of the impact area; first and second planar layers 75 and 79 of Cu or similar material, with a layer of specimen material 77 sandwicned between these two layers; an impactor plate 81 spaced apart from the three-layer sandwich 80; and a layer 83 of high explosive positioned to detonate and drive the impactor plate against the three-layer sandwich 80. The high explosive 83 is detonated at one end 83A, and the detonation front proceeds toward the other end 83B. As the detonation front advances longitudinally from one end 83A to the other end 83B, successive portions of the impactor plate are driven against the three-layer sandwich, producing a rolling motion of impactor plate 81 against the sandwich 80. This produces a travelling high pressure shock wave in the layers 75, 77 and 79 that again causes the layer 77 of specimen material to undergo a phase transition, as desired. This technique is used in explosive welding, where the object is to weld the impactor plate and the adjacent plate together. Here, the object is to drive the layers 75, 77 and 79 together; and the choice of shock wave pressures and other parameters may differ from the choices for "pure" explosive welding.

To demonstrate the method, apparatus similar to that indicated in FIG. 8, has been applied to bulk polycrystalline Nb specimens, 13 mm in diameter by 9 mm thickness, at maximum shock pressures of 0.6 Mbar, 1.0 Mbar and 1.2 Mbar. The critical temperature for manifestation of superconductivity, $T_c$, was found to decrease weakly with increasing shock pressure, from 9.18° K. for the unshocked specimen to 9.155° K. at the highest shock pressure. Maximum increase of Vickers hardness, from 75 (unshocked) to 130-150, was observed for the 0.6 Mbar specimen, and long thin grain structures were induced in specimen planes perpendicular to the direction of propagation of the shock waves.

Figure 5:
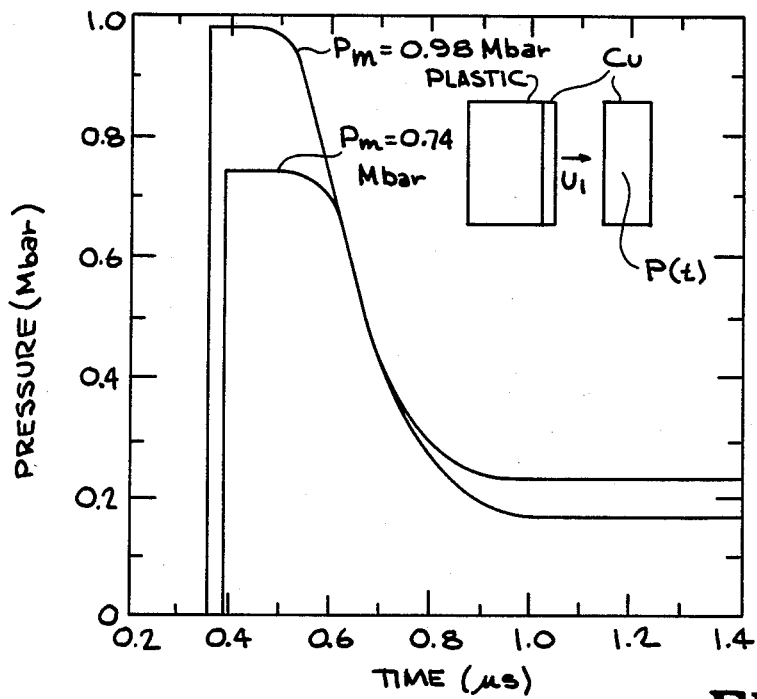
FIG. 5 is a graphical view of pressure versus time within a shocked Cu-Fe powder-Cu sandwich or embedded Nb film, for two experiments at calculated peak pressures of 0.74 Mbar and 0.98 Mbar (impact velocities of 2.76 and 3.38 km/sec, respectively), produced oy a Cu impactor 1 mm thick. The structure in the pressure rise illustrated in FIG. 4 also occurs during the initial rise shown in FIG. 5, but the time scale is too compressed to reveal this.

Next, several Nb films, each about 30 μm thick, were deposited simultaneously on Cu substrates that were 10 mm (diameter) by 1 mm (thickness). A Cu plate of 2.5 mm thickness was placed over the Nb films, and this target was subjected to shock waves induced with Cu impactor velocities of 2.76 and 3.38 km/sec; these produced shock pressures of 0.74 Mbar and 0.98 Mbar, respectively. The higher impactor velocity was chosen to produce a maximum pressure close to the pressure (0.9 Mbar) that is predicted to produce maximum shock-induced hardness and defect concentration in the pure Nb film. Calculated shock wave pressure histories for the two experiments are those of FIG. 5. For these two situations, the predicted peak shock temperatures are 1200° K. and 1900° K., respectively; upon release of the material to zero pressure, these temperatures decrease to 850° K. and 1200° K., respectively. The shock process is thermodynamically irreversible so that the material temperature does not revert to room temperature after the pressure is released. The corresponding temperatures for the solid Cu substrate and capsule are lower than for Nb.

In these experiments, the first stage of cooling, which occurs upon isentropic release to the backing pressure provided by the plastic ($\approx 0.2$ Mbar in FIG. 5), occurs in about 300 nsec; this corresponds to a bulk thermodynamic cooling rate of about $10^9$ °K/sec. The second stage of cooling occurs by conduction of heat from the Nb film to the contiguous Cu substrate and capsule on two sides of the specimen and ductile material; the time required for this to occur is estimated at tens of microseconds.

Optical photomicrographs of the Nb film embedded in the surrounding Cu material show a final Nb film thickness of about 20 μm (reduced from 30 μm as a result of late-time plastic flow) with reasonably well defined Nb-Cu interfaces for the 0.74 Mbar experiment. For the higher peak pressure of 0.98 Mbar, the Cu penetrates completely through the Nb film at some locations; here the Cu recrystallizes to smaller grain size than in the Cu substrate itself. The Nb specimens before and after the shock treatment manifested substantially the same critical temperature, $T_c$. Critical temperature for Nb is thus relatively insensitive to shock treatment below one Mbar, but Vickers hardness is increased by about 100 percent. This method allows access to previously-unexplored regions of high density phase regions.

In the abovedescribed experiments with Nb, the superconducting transition temperature is changed only modestly, about 0.1° K. out of 9.4° K., by the shock process. The upper critical magnetic field $H_{c2}$, however, is increased by a factor of about two over the corresponding field for annealed Nb; this is caused by the shock-induced defects.

Discs of Nb₃Si, 1.5-2 mm thick and 12 mm in diameter and cut from arc-melted buttons, were successfully recovered for applied shock wave pressures of 0.82 Mbar and 0.96 Mbar. The specimen subjected to 0.96 Mbar pressure was found to contain a substantial amount of A15-phase Nb₃Si with 5.09 A lattice parameter. The electrical resistance of the processed specimen goes abruptly to zero at temperature $T_c = 18°$ K. The specimen material retained its superconducting transition even after postshot "powdering", indicating that the superconductivity was induced throughout the bulk of the specimen. The electrical resistance of the specimen shocked at 0.82 Mbar pressure did not completely vanish at temperature $T = 18°$ K.

An amorphous film of Nb₃Si, shocked to 0.72 Mbar, was observed to contain small ($\lesssim 1000$ A diameter) polycrystals of A15-phase, which is the superconducting phase of this compound.

Although the preferred embodiments have been shown and described herein, variation and modification may be made without departing from the scope of the invention.

We claim:

1. A method for preparation of a class of fine grain solid materials having desirable superconducting or magnetic properties, the method comprising the steps of:

providing a first planar layer of a first predetermined solid material, with the first layer having a first end and a second end spaced apart from one another and facing one another along the plane defining the first planar layer;

providing a second planar layer comprising a second predetermined material in powder form, with the second layer having a first end and a second end spaced apart from one another and facing one another along the plane defining the second planar layer;

providing a tnird planar layer of a tnird predetermined solid material, positioned so that the second layer lies between and is transversely contiguous with the first layer and the third layer, with the third layer having a first end and a second end spaced apart from one another and facing one another along the plane defining the third planar layer;

providing an open container for the first, second and third planar layers, with the container having a first wall that is transversely contiguous with the third layer and is positioned so that the third layer lies between the second layer and the first container wall, and with the container having side walls that fit snugly against the first and second ends of each of the first and third planar layers of solid material, the container being composed of rigid material that resists deformation caused by deformation of adjacent material in the first layer or the third layer;

providing a shock wave with velocity of propagation that is supersonic with respect to the speed of sound in each of the first, second and third predetermined materials;

causing the shock wave to propagate substantially transversely through the first planar layer, the second planar layer and the third planar layer in that order so that the second layer of powder is compressed and heated to a temperature substantially as large as or greater than the highest melt temperature of the materials comprising the second layer, with an associated shock wave pressure of at least 50 kilobars;

allowing the powder in the second planar layer to at least partially melt so that the powder particles coalesce into a material of higher material density than the initial material density of the second layer; and allowing excess thermal energy in this former powder layer to rapidly flow into the contiguous first and third planar layers of material, to achieve rapid cooling of the second layer to temperatures substantially the same as the temperature in the first and third layers.

2. The method of claim 1, wherein said step of rapid cooling of said second planar layer occurs in a time of substantially 50 microseconds or less.

3. The method of claim 1, including the further step of choosing said powders for said second layer from the class consisting of the following combinations: Pb/Mo/S, Eu/Mo/S, Sn/Eu/Mo/S; Pb/Eu/Mo/S, La/Eu/Mo/S, Sn/Mo/S, Sn/Al/Mo/S, Nb/N, Mo/N, V/Si, Nb/Si, Nb/Ge, Nb/Al/Ge, Nb/Al, Nb/Ga, Nb/Ti and Nb/Zr.

4. The method of claim 1, including the further step of choosing said powders for said second layer from the class consisting of the following combinations: Sm/Co, Fe/B/Nd, Fe/B/Pr, Fe/B/Sm, Fe/B/Eu, Fe/B/Co, Fe/B/Ni, Fe/B/Nd/Pr, Fe/B/Nd/Sm, Fe/B/Nd/Eu, Fe/B/Nd/Co and Fe/B/Nd/Ni.

5. The method of claim 1, including the further step of choosing said first and said third predetermined materials from the class consisting of Cu, Al and steel.

6. The method of claim 1, including the further step of causing said shock wave to also propagate longitudinally from a first end of each of said first, said second and said third layers to a second end of each of said first, said second and said third layers, simultaneously with propagation of said shock wave substantially transversely through said first, said second and said third layers.

7. The method of claim 1, including the further step of providing a massive block of high density material such as lead adjacent to said sides of said first, second and third planar layers to provide stability for said open container side walls.

8. The product produced by the method of claim 1.

9. A method for preparation of a class of solid materials having superconductivity critical magnetic fields of at least 150 kilogauss, the method comprising the steps of:

providing a first planar layer of a first predetermined solid material;

providing a second planar layer of a film or bulk specimen of a second predetermined solid material containing two or more predetermined chemical elements or other materials;

providing a third planar layer of a third predetermined solid material, positioned so that the second layer lies between and is transversely contiguous with the first layer and the third layer;

providing a rigid, substantially planar surface that is transversely contiguous with the third layer and is positioned so that the third layer lies between the second layer and the rigid planar surface;

providing a shock wave with velocity of propagation that is supersonic with respect to the speed of sound in each of the first, second and third layers;

causing the shock wave to propagate transversely through the first layer, the second layer and the third layer in that order so that the second layer is compressed and heated to a temperature sufficient to induce a phase transformation in the material in the second layer;

allowing the material in the second layer to undergo a phase change and to transform into material with a different crystal structure; and allowing excess thermal energy in the second layer to rapidly flow into the contiguous first and third layers of material to achieve cooling of the first layer to temperatures of no more than 500° K. in a time interval of substantially ten microseconds or greater.

10. The method of claim 9, including the further step of choosing said material for said second layer from the class consisting of the following combinations: Pb/Mo/S, Eu/Mo/S, Sn/Eu/Mo/S; Pb/Eu/Mo/S, La/Eu/Mo/S, Sn/Mo/S, Sn/Al/Mo/S, Nb/N, Mo/N, V/Si, Nb/Si, Nb/Ge, Nb/Al/Ge, Nb/Al, Nb/Ga, Nb/Ti and Nb/Zr.

11. The method of claim 9, including the further step of choosing said material for said second layer from the class consisting of the following combinations: Sm/Co, Fe/B/Nd, Fe/B/Pr, Fe/B/Sm, Fe/B/Eu, Fe/B/Co, Fe/B/Ni, Fe/B/Nd/Pr, Fe/B/Nd/Sm, Fe/B/Nd/Eu, Fe/B/Nd/Co and Fe/B/Nd/Ni.

12. The method of claim 9, including the further step of choosing said first and said third predetermined materials from the class consisting of Cu, Al and steel.

13. The method of claim 9, including the further step of causing said shock wave to also propagate longitudinally from a first end of each of said first, said second and said third layers to a second end of each of said first, said second and said third layers, simultaneously with propagation of said shock wave substantially transversely through said first, said second and said third layers.

14. The method of claim 9, including the further step of providing a massive block of high density material such as lead positioned at said sides of said first, second and third planar layers to provide stability for said open container side walls.

15. The method of claim 9, including the further step of providing a fourth layer of a fourth predetermined material, of thickness substantially $10^2$–$10^4$ μm, transversely contiguous with and positioned between said second planar layer and said third planar layer, to serve as a substrate for a film specimen in said second planar layer.

16. The method of claim 15, including the further step of choosing said material for said fourth planar layer from the class consisting of copper, steel and sapphire.

17. The product produced by the method of claim 9.

* * * * *